United States Patent [19]

Gay

[11] Patent Number: 4,524,332

[45] Date of Patent: Jun. 18, 1985

[54] INTEGRATED NOTCH FILTER

[75] Inventor: Michael J. Gay, Vaud, Switzerland

[73] Assignee: Motorola, Inc., Schaumburg, Ill.

[21] Appl. No.: 347,656

[22] Filed: Feb. 10, 1982

[51] Int. Cl.³ .............................................. H03F 1/34
[52] U.S. Cl. .................................... 330/294; 330/107; 330/303; 330/305; 330/306
[58] Field of Search ............... 330/107, 109, 126, 252, 330/260, 294, 303, 305, 306, 307; 307/520, 521; 328/167; 333/172, 174, 176; 358/31, 39, 40

[56] References Cited

U.S. PATENT DOCUMENTS 3,501,709  3/1970  Uetrecht ............................ 330/303

Primary Examiner—James B. Mullins
Attorney, Agent, or Firm—Joe E. Barbee

[57] ABSTRACT

A notch filter is provided having a low-pass section and a summing section which are capable of being integrated on a single semiconductor chip. The summing section provides an output signal which is the sum of a first component signal proportional to an output signal of the low-pass section and a second component signal proportional to current flowing in a capacitor in the low-pass section such that the high-frequency response of the low pass section is compensated to provide an output signal characteristic of a notch filter.

7 Claims, 9 Drawing Figures

— PRIOR ART —

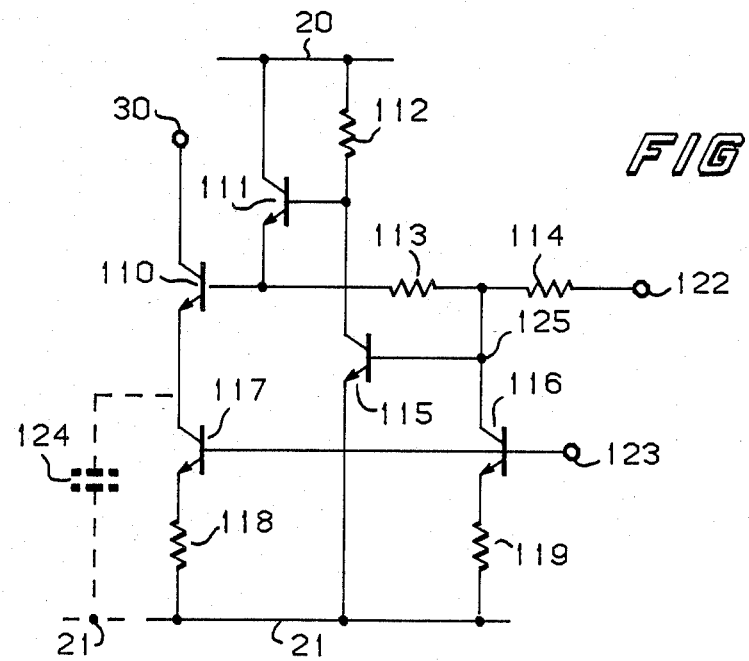
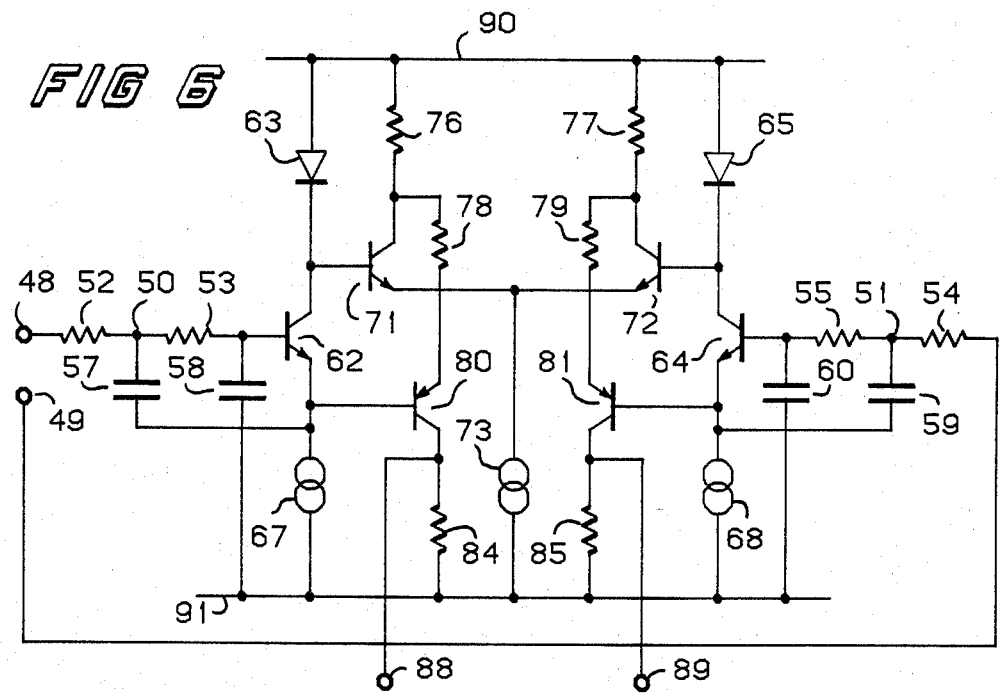

INTEGRATED NOTCH FILTER

This invention relates, in general, to notch filters, and more particularly, to a notch filter suitable for being fully implemented in an integrated circuit.

In many electronic systems it is necessary to separate a desired signal component from an undesired signal component at a different frequency. The phase detector is one example. The desired phase detector output, which is a measure of the phase difference between two input signals of the same frequency, is contaminated by a signal at twice the frequency of the input. Another example occurs in the demodulation of luma information carried in a TV video signal. The chroma subcarrier is summed to the luma signal before transmission and must be removed in the luma processing channel of the TV receiver.

The undesired signal components are often removed by inserting a notch filter in the signal path. Such a filter has a transmission characteristic which provides a notch or maximum attenuation at the undesired frequency and has minimal effect at other frequencies in the signal band.

Notch filters are commonly realized using inductors and capacitors in an LC filter. In the prior art, therefore, an integrated circuit implementation of an electronic system having a notch filter requires external tuned elements. It is desirable to implement such systems, including the notch filter, with as few external elements as possible.

Accordingly, it is an object of this invention to provide a means of implementing a notch filter in an integrated circuit without using external tuning elements.

Another object of this invention is to provide improved notch filters suitable for use in the chroma and luma demodulation circuits of TV receivers. It will be understood that the disclosed invention may be used for other applications requiring filters operating in the MHz frequency range. Some of the techniques described are also applicable at lower frequencies where some components must be external due to size limitations.

SUMMARY OF THE INVENTION

In carrying out the above and other objects of the invention, there is provided, in one form, a notch filter having an input and an output and comprising a low-pass filter section and a summing section. The low-pass filter section has a first reactive element, a second reactive element, at least one resistor, an input coupled to the input of the notch filter, a low-pass output, and a differentiated output. The differentiated output is derived from a signal at the first reactive element which is provided by differentiating the low-pass output signal with a time constant determined by the second reactive element and the at least one resistor. The summing section includes a first input coupled to the low-pass output, a second input coupled to the differentiated output, and an output coupled to the output of the notch filter. The summing section provides an output signal proportional to the magnitude difference of the low-pass output signal and the differentiated output signal so that the notch filter output signal becomes zero at a predetermined notch frequency.

BRIEF DESCRIPTION OF THE DRAWINGS

FIG. 5 is a schematic of a compensation circuit for eliminating the effects of isolation capacitance associated with the capacitance multiplier tuning circuit of FIG. 3.

FIG. 6 is a schematic of a second preferred embodiment of the invention which is a differential implementation of the notch filter.

DETAILED DESCRIPTION OF THE DRAWINGS

A simple notch filter can be represented in Laplace transform notation by the transfer function:

$$F(s) = \frac{1 + s^2 \tau_1^2}{1 + a s \tau_2 + s^2 \tau_2^2} \quad (1)$$

where $\tau_1$, $\tau_2$, and $a$ are design constants.

The transfer function of Equation (1) results in a pole-zero diagram having a pair of complex conjugate poles, $s_{p1}$ and $s_{p2}$, and a pair of zeroes, $s_{z1}$ and $s_{z2}$, given by:

$$s_{p1} = \frac{-a}{2\tau_2} + \frac{j}{\tau_2}\sqrt{1 - \frac{a^2}{4}}$$

$$s_{p2} = \frac{-a}{2\tau_2} - \frac{j}{\tau_2}\sqrt{1 - \frac{a^2}{4}}$$

$$s_{z1} = \frac{j}{\tau_1}$$

$$s_{z2} = \frac{-j}{\tau_1}$$

The notch frequency is set by the location of the zeroes and is, therefore, determined by selection of $\tau_1$. The filter response about the notch frequency is tailored by the selection of the pole locations.

If the imaginary parts of the pole locations are selected to equal those of the zero locations, it follows that:

$$\tau_2 = \tau_1 \sqrt{1 - \frac{a^2}{4}} \quad (2)$$

The filter represented by this selection of pole-zero locations provides a notch at angular frequency $1/\tau_1$. The 3 db frequencies of the notch are defined by the pole locations of the transfer function, being offset from the notch frequency by $\pm \alpha/2\tau_2$.

Equation (1) can be rearranged as follows:

$$F(s) = H(s) + H(s)G(s)$$

where H(s) and G(s) are given by:

$$H(s) = \frac{1}{1 + \alpha s\tau_2 + s^2\tau_2^2} \quad (3)$$

$$G(s) = s^2\tau_1^2 \quad (4)$$

Therefore, the transfer function of the notch filter can be realized by summing the transfer function of Equation (3) with the product of the transfer functions of Equation (3) and Equation (4).

Equation (3) is a Laplace transform representation of a low-pass filter. Various implementations of such a filter are well-known in the art. The preferred embodiments of the invention described below illustrate the use of low-pass filters of the Sallen-Key and Rauch configurations. However, any implementation which derives the signal $H(s) \cdot G(s)$, as defined in Equations (3) and (4), is appropriate for use in the notch filter disclosed herein. Similarly, there are many ways to implement the summing function required to form the notch filter response. The preferred embodiments described below illustrate only a few of the many possible means for implementing the summing section of the notch filter. The summing circuit provides an output signal dependent on the magnitude difference of the input signals. The output is independent of phase variations in the summing input signals since the two input signals to the summing section are in phase or 180° out of phase with each other for all frequencies.

Figure 1:
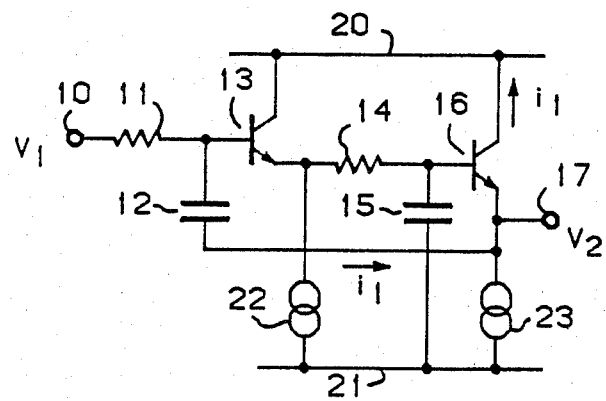
FIG. 1 is a schematic of one embodiment of a Sallen-Key low-pass filter.

FIG. 1 illustrates one implementation of the filter defined by Equation (3). This is a form of the well-known Sallen-Key filter which is constructed using emitter followers as active elements. The Sallen-Key configuration is convenient for integrated circuit implementation and minimizes the effects of parasitic capacitances associated with integrated circuits.

In FIG. 1, input resistor 11 couples input node 10 to the base of transistor 13. Resistor 14 couples the emitter of transistor 13 to the base of transistor 16. The collectors of transistors 13 and 16 are coupled to a first voltage bus 20. Current source 22 is coupled between the emitter of transistor 13 and a second voltage bus 21 to provide bias current. Current source 23 is coupled between the emitter of transistor 16 and voltage bus 21. Capacitor 15 is coupled between the base of transistor 16 and voltage bus 21. Output node 17 is coupled to the emitter of transistor 16 and feedback capacitor 12 couples output node 17 to the base of transistor 13.

The transfer function corresponding to the circuit of FIG. 1 is given by:

$$\frac{V_2}{V_1} = \frac{1}{1 + SC_2R_2 + s^2C_1C_2R_1R_2} \quad (5)$$

where $V_1$ is the voltage at input node 10, $V_2$ is the voltage at output node 17, $C_1$ is the capacitance of capacitor 12, $C_2$ is the capacitance of capacitor 15, $R_1$ is the resistance of resistor 11 and $R_2$ is the resistance of resistor 14.

Deriving the signal current $i_1$ flowing in feedback capacitor 12 results in:

$$i_1 = V_2 S^2 C_1 C_2 R_2 \quad (6)$$

Assuming ideal transistors, current $i_1$ also flows in the collector of transistor 16.

If a current equal to $i_1$ is passed through a resistance $R_X$ and the resulting voltage developed across resistance $R_X$ is summed to voltage $V_2$, the sum voltage $V_0$ will be given by:

$$V_0 = V_2(1 + S^2C_1C_2R_2R_X) \quad (7)$$

Substituting for $V_2$ from Equation (5) yields:

$$\frac{V_0}{V_1} = \frac{1 + S^2C_1C_2R_2R_X}{1 + SC_2R_2 + S^2C_1C_2R_1R_2} \quad (8)$$

Equation (8) is equal to Equation (1) with the design constants defined by:

$$\tau_1 = \sqrt{C_1C_2R_2R_X} \quad (8a)$$

$$\tau_2 = \sqrt{C_1C_2R_1R_2} \quad (8b)$$

$$\alpha = \sqrt{\frac{C_2R_2}{C_1R_1}} \quad (8c)$$

Therefore, Equation (8) represents the transfer function of a notch filter with $\tau_1$ being independently variable of $\tau_2$ and $\alpha$ by the choice of $R_X$.

As noted above, there are many ways to sum the voltage derived from current $i_1$ to the voltage $V_2$, thereby implementing the notch filter. The discussion of FIGS. 2-6 treats two preferred embodiments to perform this function. The preferred embodiments are adapted to two different applications which require the notch frequency to be tunable in response to external control signals.

Figure 2:
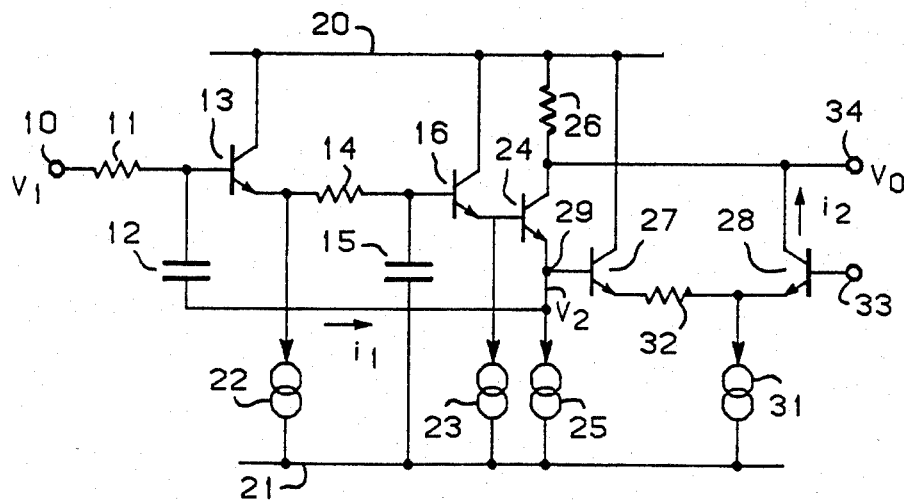
FIG. 2 is a schematic of a first preferred embodiment of the notch filter.

FIG. 2 shows a schematic of the first preferred embodiment. The means for tuning the notch is omitted for simplification. Input resistor 11 couples input node 10 to the base of transistor 13. Resistor 14 couples the emitter of transistor 13 to the base of transistor 16. The collectors of transistors 13 and 16 are coupled to a first voltage bus 20. Current source 22 is coupled between the emitter of transistor 13 and a second voltage bus 21 to provide bias current. Current source 23 is coupled between the emitter of transistor 16 and voltage bus 21. Capacitor 15 is coupled between the base of transistor 16 and voltage bus 21. The emitter of transistor 16 is coupled to the base of transistor 24. Feedback capacitor 12 is coupled between the emitter of transistor 24 and the base of transistor 13. Current source 25 is coupled between the emitter of transistor 24 and voltage bus 21, and the collector of transistor 24 is coupled to voltage bus 20 via resistor 26. Transistors 27 and 28 and resistor 32 form a differential amplifier. Transistor 27 has a base coupled to the emitter of transistor 24 and a collector coupled to voltage bus 20. Transistor 28 has a base coupled to bias voltage node 33. Current source 31 provides bias current to the differential amplifier and is coupled between the emitter of transistor 28 and voltage bus 21. Resistor 32 couples the emitter of transistor 27 to the emitter of transistor 28. Output node 34 is coupled to the collector of transistor 24 and to the collector of transistor 28.

Assuming ideal transistors, current component $i_1$ given by Equation (6) will flow through resistor 26. A signal current component $i_2$ will also flow in resistor 26 and the collector of transistor 28. Current $i_2$ will be equal to $V_2/R_3$ due to the operation of the differential amplifier, where $R_3$ is the resistance of resistor 32 and $V_2$ is the voltage at node 29. The transfer function of the circuit of FIG. 2 is given by:

$$\frac{V_O}{V_I} = \frac{R_4}{R_3} \cdot \frac{1 + S^2 C_1 C_2 R_2 R_3}{1 + SC_2 R_2 + S^2 C_1 C_2 R_1 R_2} \tag{9}$$

where $V_O$ is the voltage at output node 34.

The transfer function of Equation (9) differs from Equation (8) only by a scaling factor where the resistance $R_X$ is equal to $R_3$. The notch characteristic of Equation (1) is, therefore, provided by the embodiment of FIG. 2.

For integrated circuit realizations of the notch filter, it is desirable to make the notch frequency tunable to compensate for variations in tuning component values resulting from fabrication processes. The pole and zero locations of the notch filter may be adjusted by varying capacitances $C_1$ and $C_2$ or resistance $R_2$ of Equations (8a), (8b), and (8c). The real component of the pole locations and, therefore, the shape of the notch remains constant regardless of variations in $C_2$ or $R_2$. Accordingly, variation of these elements is likely to be preferred in tuning the notch. However, it will be understood that tuning may also be achieved by varying $C_1$.

Figure 3:
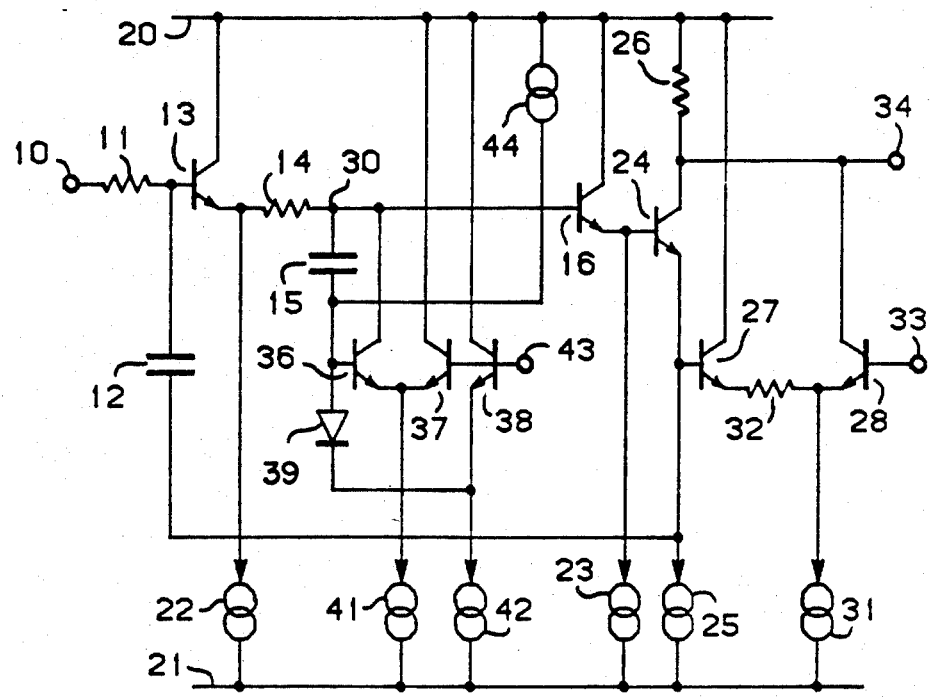
FIG. 3 is a schematic of the preferred embodiment of FIG. 2 further including a capacitance multiplier for electrically tuning the notch filter.

The notch filter can be made tunable by the addition of a capacitance multiplier circuit to vary capacitance $C_2$ as shown in FIG. 3. The elements of FIG. 3 having the same numbers as those of FIG. 2 will not be discussed further since they were discussed in relation to FIG. 2. The capacitance multiplier of FIG. 3 includes transistors 36, 37, and 38. The collector of transistor 36 is coupled to the base of transistor 16 and the collectors of 37 and 38 are coupled to voltage bus 20. The emitter of transistor 36 is coupled to the emitter of transistor 37. Current source 41 is coupled between the emitter of transistor 36 and voltage bus 21 to provide a bias current for the differential amplifier formed by transistors 36 and 37. The base of transistor 37 and the base of transistor 38 are coupled to bias voltage node 43. Diode 39 has an anode coupled to the base of transistor 36 and a cathode coupled to the emitter of transistor 38. Current source 42 is coupled between the emitter of transistor 38 and voltage bus 21 to provide bias current. Current source 44 is coupled between voltage bus 20 and the base of transistor 36. Capacitor 15 of FIG. 3 is coupled between the base and collector of transistor 36, unlike capacitor 15 of FIG. 2.

The capacitance multiplier forms a variable gain amplifier responsive to one or more control signals. The signal current flowing in capacitor 15 passes through diode 39 and develops a differential voltage between the bases of transistors 36 and 37. It can be shown that $C_m$, the effective capacitance between node 30 and bus 21, is given by:

$$C_m = C_2(1+K)$$

where $C_2$ is the capacitance of capacitor 15 and K is the ratio of the current supplied by current source 41 to the current supplied by current source 42.

Substituting $C_m$ into Equations (8a) and (8c) and using Equation (2), $\tau_1$ and $\tau_2$ are given by:

$$\tau_1 = \sqrt{C_1 C_m R_2 R_3} \tag{10}$$

$$\tau_2 = \sqrt{C_1 C_m R_1 R_2} \sqrt{1 - \frac{C_m R_2}{4 C_1 R_1}} \tag{11}$$

If the notch is to be reasonably narrow, the filter must have a moderately high quality factor Q. Making this assumption, we find:

$$C_m R_2 / 4 C_1 R_1 < 1$$

For example, the term may have a value less than 0.05.

Therefore, to a high degree of accuracy Equation (11) can be approximated by:

$$\tau_2 = \sqrt{C_1 C_m R_1 R_2} \tag{12}$$

From Equations (10) and (12), it can be seen that the imaginary parts of the pole and zero locations will remain substantially in a fixed ratio as the tuning capacitance $C_m$ is varied. This means the notch may be adjusted to a desired frequency or may be made to track a variable frequency while retaining essentially the same shape.

Several problems related to integrated circuit fabrication must be considered to ensure that the circuits of FIG. 2 and FIG. 3 operate as described. It is well known that the fabrication of a capacitor in an integrated circuit creates stray capacitances from one terminal of the capacitor to other points in the integrated circuit. For capacitor 15 this presents no major problem since the capacitor may be connected having the parasitic capacitance to the ground terminal in FIG. 2 or to current source 44 in FIG. 3 which has a low impedance to voltage bus 20. However, stray capacitance from either terminal of capacitor 12 can create capacitive loading having a detrimental effect on circuit operation. These problems can be avoided by arranging for the parasitic capacitance of capacitor 12 to be connected between the emitter and base of transistor 24. Since there will be very little signal voltage between these points, minimal current will flow in the parasitic capacitance.

Figure 4:
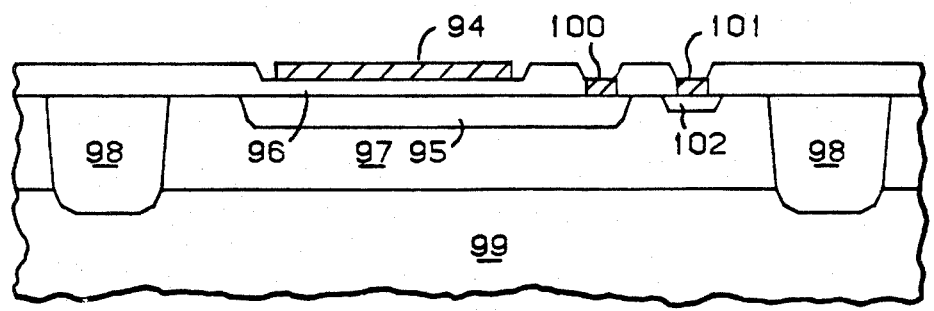
FIG. 4 illustrates a cross section of a three-layer semiconductor structure used to minimize effects of parasitic capacitance in the first and second preferred embodiments of the invention.

FIG. 4 shows a three-layer semiconductor structure which permits the realization of this connection of capacitor 12. Capacitor 12 is the capacitance between a metal layer 94 and a P diffusion 95 with a thin oxide or nitride dielectric 96. Metal layer 94 is connected to the base of transistor 13, metallization 100 is connected to the emitter of transistor 24, and metallization 101 is connected to the base of transistor 24. P diffusion 95 is placed in an N-type epitaxial area 97 which is coupled to metallization 101 by N+ diffusion 102. Epitaxial area 97 is isolated by P+ isolation diffusion 98. The parasitic capacitance due to the junction capacitance between P diffusion 95 and epitaxial layer 97 is thus connected between the base and emitter of transistor 24 as required. The parasitic capacitance from epitaxial layer 97 to isolation diffusion 98 and substrate 99 appears between the base of transistor 24 and ground. The circuit can be designed to tolerate this capacitive loading.

The coupling of epitaxial layer 97 to the base of transistor 24 is sometimes referred to as a "bootstrap connection." This coupling may be made to any node having substantially the same signal as appears at the emitter of transistor 24 and which can tolerate the capacitive loading. If the emitter of transistor 16 is not suitable in a particular design then another emitter follower, for example, with the base coupled to the emitter of transistor 16, may be added to provide a suitable bootstrap point.

A parasitic capacitance, known as a land or isolation capacitance, will also be associated with transistor 36 from the collector to substrate. This capacitance may be comparable to the capacitance of capacitor 15 and inhibit satisfactory operation of the tuning circuit. FIG. 5 is a schematic of a compensation circuit which can eliminate the effects of the isolation capacitance. Input node 122 is coupled by resistor 114 to the base of transistor 115 and to the collector of transistor 116. The emitter of transistor 115 is coupled to voltage bus 21 and the collector of transistor 115 is coupled to the base of transistor 111. Resistor 112 couples the base of transistor 111 to voltage bus 20. The collector of transistor 111 is coupled to voltage bus 20 and the emitter is coupled by resistor 113 to the base of transistor 115. The emitter of transistor 111 is also coupled to the base of transistor 110 which has a collector coupled to node 30 corresponding to node 30 in FIG. 3. The emitter of transistor 110 is coupled to the collector of transistor 117 and the base of transistor 117 is coupled to the base of transistor 116 and to bias voltage node 123. Resistor 118 couples the emitter of transistor 117 to voltage bus 21 and resistor 119 couples the emitter of transistor 116 to voltage bus 21. The isolation capacitance associated with transistor 117 is represented by capacitor 124 connected between the collector of transistor 117 and voltage bus 21. Input node 122 is coupled to the emitter of transistor 16 of FIG. 3.

Transistors 111 and 115 and resistors 112, 113, and 114 form a shunt feedback amplifier providing an output at the emitter of transistor 111 which is an inverted version of the signal present at nodes 122 and 30. Transistor 117 and resistor 118 form a current source for transistor 110. Transistor 117 is dimensioned so that the current flowing in isolation capacitance 124 is equal in magnitude and opposite in phase to the current flowing in the collector isolation capacitances of transistor 110 and transistor 36 of FIG. 3. Therefore, the net current flow at node 30 due to collector isolation capacitance will be zero.

The first preferred embodiment of FIG. 3 is suitable for providing a notch which is tunable to eliminate the effect of component tolerances or to follow a variable frequency. Such a filter may be employed, for example, in a multi-standard TV chroma decoding circuit and would be tuned according to the standard being received to remove the chroma subcarrier from the luma signal. For example, the notch would be tuned to 3.58 MHz for NTSC operation, to 4.433 MHz for PAL operation, and to track over 3.9 MHz to 4.756 MHz for SECAM operation. In this application the decoding circuit would be supplied with accurate reference frequencies to allow tuning of the notch by automatic means.

The second preferred embodiment of the invention shown in FIG. 6 provides a second-order low-pass response together with a tunable notch. One application of this embodiment is as an output filter for a phase detector. The notch may be tuned to the second harmonic of the phase detector input frequency. The second harmonic of the input signal is the highest-energy frequency component contaminating the phase detector output and has the lowest frequency of all the undesired components present at the phase detector output. The notch may alternately be tuned to some other frequency if desired.

Since a phase detector provides a balanced output, it is convenient to realize the filter in the differential form of FIG. 6. Input node 48 is connected by resistor 52 to node 50 which is connected by resistor 53 to the base of transistor 62. The emitter of transistor 62 is coupled to voltage bus 91 by current source 67 and is also coupled to node 50 by capacitor 57. Capacitor 58 couples the base of transistor 62 to voltage bus 91. The collector of transistor 62 is coupled to the cathode of diode 63 and the anode of diode 63 is coupled to voltage bus 90. Input node 49 is coupled by resistor 54 to node 51 which is coupled by resistor 55 to the base of transistor 64. Capacitor 60 couples the base of transistor 64 to voltage bus 91. The emitter of transistor 64 is coupled to voltage bus 91 by current source 68 and is also coupled to node 51 by capacitor 59. The collector of transistor 64 is coupled to the cathode of diode 65 and the anode of diode 65 is coupled to voltage bus 90. The sections described above form a Sallen-Key filter having a differential input at nodes 48 and 49 and providing a differential voltage output at the emitters of transistors 62 and 64.

A second differential output voltage developed at the collectors of transistors 62 and 64 is applied to the input of a differential amplifier formed by transistors 71 and 72. Transistor 71 has a base connected to the collector of transistor 62 and an emitter coupled to the emitter of transistor 72 which has a base coupled to the collector of transistor 64. Current source 73 couples the emitters of transistors 71 and 72 to voltage bus 91. The collector of transistor 71 is coupled by load resistor 76 to voltage bus 90 and the collector of transistor 72 is coupled by load resistor 77 to voltage bus 90. By applying the differential voltage between the cathodes of diodes 63 and 65 to the inputs of the differential amplifier, signal currents will flow in resistors 76 and 77 equal to the currents in diodes 63 and 65, respectively. A differential voltage will be developed between the collectors of transistor 71 and 72 which is dependent on the ratio of the current provided by current source 73 to the sum of the currents provided by current sources 67 and 68. The emitter of transistor 62 is coupled to the base of transistor 80 which has a collector coupled to output node 88 and to voltage bus 91 by resistor 84. The emitter of transistor 64 is coupled to the base of transistor 81 which has a collector coupled to output node 89 and to bus 91 by resistor 85. The emitter of transistor 80 is coupled to the collector of transistor 71 by resistor 78 and the emitter of transistor 81 is coupled to the collector of transistor 72 by resistor 79.

It can be shown that $V_2$, the differential voltage between the collectors of transistors 71 and 72, is given by:

$$V_2 = -V_3 \cdot S^2 C_1 C_2 R_2 \cdot \frac{I_2}{2I_1} \cdot \frac{R_3 R_4}{R_3 + R_4} \tag{13}$$

where $V_3$ is the differential voltage between the emitters of transistors 62 and 64; $C_1$ is the capacitance of capacitor 57 or 59, both capacitors being nominally equal; $C_2$ is the capacitance of capacitor 58 or 60, both capacitors being nominally equal; $R_2$ is the resistance of resistor 53 or 55, both resistors being nominally equal; $I_2$ is the current provided by current souce 73; $I_1$ is the current provided by current source 67 or 68, both current sources being nominally equal; $R_3$ is the resistance of resistor 78 or 79, both resistors being nominally equal; and $R_4$ is the resistance of resistors 76 or 77, both resistors being nominally equal.

The final output voltage between nodes 88 and 89, $V_0$, is then given by:

$$V_0 = V_i \frac{\frac{R_5}{R_3 + R_4}\left(1 + s^2 C_1 C_2 R_2 \cdot \frac{I_2}{2I_1} \cdot R_4\right)}{1 + sC_2(R_1 + R_2) + s^2 C_1 C_2 R_1 R_2} \tag{14}$$

where $V_i$ is the differential input voltage between nodes 48 and 49 and $R_5$ is the resistance of resistor 84 or 85, both resistors being nominally equal.

The denominator of Equation (14) represents the low pass filter characteristic and the numerator provides the desired zeroes occurring at the angular frequencies:

$$\omega_z = \sqrt{C_1 C_2 R_2 R_4 \cdot \frac{I_2}{2I_1}} \tag{15}$$

The zeroes of Equation (15) are adjustable in response to variations of the currents $I_1$ and $I_2$ provided by current sources 73 and 67–68 respectively.

The circuit of FIG. 6, therefore, provides a low pass filter plus a notch filter which may be tuned to a frequency of a particularly troublesome undesired signal. The notch frequency may be chosen independently of the low low-pass cutoff frequency and, therefore, can be within the pass band of the low-pass section.

When used with the phase detector in an FM system, the notch frequency may be modulated to follow the received frequency by modulating the current provided by current sources 67, 68, and 73 in response to a control signal derived from the FM frequency discriminator.

The first and second preferred embodiments of FIG. 2 and FIG. 6 utilize the Sallen-Key configuration for the low-pass section of the notch filter. As previously explained, other low-pass configurations may also be used to provide the necessary filter response. For example, FIG. 7 illustrates a schematic of a Rauch filter which may be used for the low-pass section.

Figure 7:
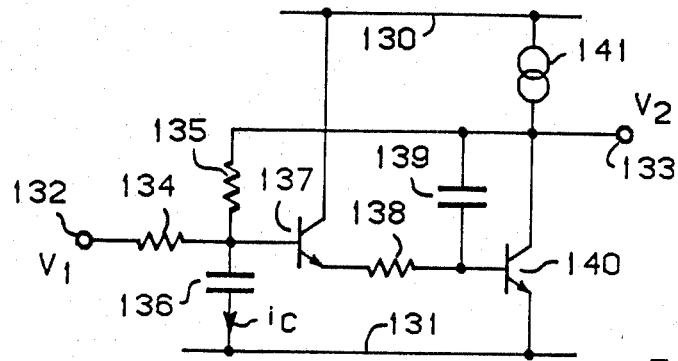
FIG. 7 is a schematic of one embodiment of a Rauch low-pass filter.

In FIG. 7, input resistor 134 couples input node 132 to the base of transistor 137. The collector of transistor 137 is coupled to voltage bus 130. Capacitor 136 is coupled between the base of transistor 137 and voltage bus 131. Resistor 138 is coupled between the emitter of transistor 137 and the base of transistor 140. The emitter of transistor 140 is coupled to voltage bus 131 and the collector of transistor 140 is coupled to output node 133. Resistor 135 couples the base of transistor 137 to the collector of transistor 140. Capacitor 139 couples the collector of transistor 140 to the base of transistor 140. Current source 141 couples the collector of transistor 140 to voltage bus 130.

The transfer function corresponding to the circuit of FIG. 7 is given by:

$$\frac{V_2}{V_1} = \frac{-R_3}{R_1} \cdot \frac{1}{1 + \frac{sC_2 R_1 R_2}{R_3} + s^2 C_1 C_2 R_1 R_2} \tag{16}$$

where $V_2$ is the voltage at output node 133, $V_1$ is the voltage at input node 132, $R_1$ is the resistance of resistor 134, $R_2$ is the resistance of resistor 138, $R_3$ is the resistance of resistor 135, $C_1$ is the capacitance of capacitor 136, and $C_2$ is the capacitance of capacitor 139.

The signal current flowing in capacitor 136 is given by:

$$i_c = -V_2 s^2 C_1 C_2 R_2. \tag{17}$$

Figure 8:
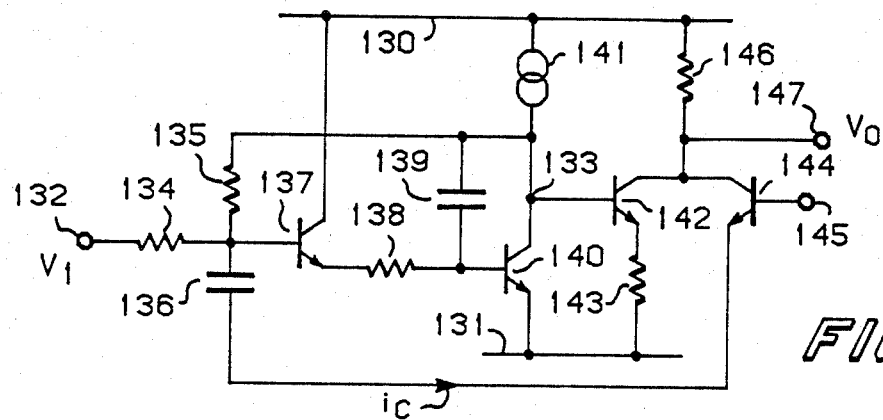
FIG. 8 is a schematic of a third preferred embodiment of the notch filter.

A notch filter is formed by summing signals derived from current $i_c$ and voltage $V_2$, analogous to the method described in connection with FIG. 2. FIG. 8 shows one such notch filter.

With the exception of capacitor 136, the elements of FIG. 8 comprising the low-pass section remain the same as in FIG. 7 and will not be discussed further. The elements of FIG. 8 which are not present in FIG. 7 comprise the summing section of the notch filter. Output node 133 is coupled to the base of transistor 142. The collector of transistor 142 and the collector of transistor 144 are coupled to output node 147. Resistor 146 couples output node 147 to voltage bus 130. Resistor 143 couples the emitter of transistor 142 to voltage bus 131. The base of transistor 144 is coupled to bias voltage node 145. Capacitor 136 is coupled between the base of transistor 137 and the emitter of transistor 144.

The transfer function of the circuit of FIG. 8 is given by:

$$\frac{V_o}{V_1} = \frac{R_3 R_5}{R_1 R_4} \frac{1 + S^2 C_1 C_2 R_2 R_4}{1 + s\frac{C_2 R_2 R_1}{R_3} + s^2 C_1 C_2 R_1 R_2} \tag{18}$$

where $V_o$ is the voltage at output node 147, $R_5$ is the resistance of resistor 146, and the other variables represent the same elements as in Equation (16).

Figure 9:
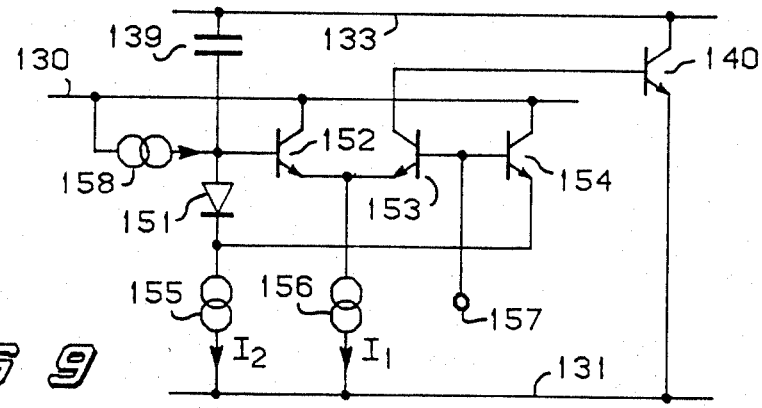
FIG. 9 is a schematic of a tuning circuit which may be used to vary the notch frequency of the preferred embodiment of FIG. 8.

A comparison of Equation (18) and Equation (1) verifies that the circuit of FIG. 8 represents a notch filter. As in the previous embodiments, the notch frequency can be tuned by varying the capacitance of $C_1$ or $C_2$. FIG. 9 illustrates a schematic of a tuning circuit which may be added to the circuit of FIG. 8 to vary the capacitance between the base and collector of transistor 140.

The elements of FIG. 9 having the same numbers as those of FIG. 8 will not be discussed further, with the exception of capacitor 139. Transistors 152 and 153 form a differential amplifier which is biased by current source 156. Capacitor 139 couples node 133 to the base of transistor 152 and also to the anode of diode 151. The emitter of transistor 152 and the emitter of transistor 153 are coupled together. Current source 156 couples the emitters of transistors 153 and 156 to voltage bus 131. The base of transistor 153 is coupled to the base of transistor 154 and also to bias voltage node 157. The emitter of transistor 154 is coupled to the cathode of diode 151. The collector of transistor 152 and the collector of transistor 154 are coupled to voltage bus 130. The collector of transistor 153 is coupled to the base of transistor 140. The collector of transistor 140 is coupled to node 133 and the emitter of transistor 140 is coupled to voltage bus 131. Current source 155 is coupled between voltage bus 131 and the cathode of diode 151. Current source 158 is coupled between voltage bus 130 and the anode of diode 151 in order to provide a DC current path to bias the diode.

An analysis of the circuit of FIG. 9 will show that $C_E$, the effective capacitance between the collector and base of transistor 140, is given by:

$$C_E = C_2 \frac{I_1}{I_2} \quad (19)$$

where $I_1$, is the current provided by current source 156 and $I_2$ is the current provided by current source 155. By varying either or both $I_1$ and $I_2$, the notch frequency of the filter of FIG. 8 can be varied. As with the previously disclosed embodiments of the invention, this tuning may be achieved by automatic means.

The notch filter embodiment of FIG. 8 and FIG. 9 does not require the isolation capacitance cancellation disclosed in relation to FIG. 5. It also does not require the special semiconductor structure disclosed in connection with FIG. 4. The embodiment, however, is susceptible to instability in the feedback loop comprised of capacitor 139, diode 151, and transistors 152, 153 and 140.

This disclosure provides for a new and improved notch filter which is integrable without external tuned elements. The notch filter is suitable for use in the chroma and luma demodulation circuits of TV receivers and for other applications requiring notch filters operating at comparable frequencies. Additionally, the techniques disclosed may be used at lower frequencies where some components may not be integrable due to size limitations.

I claim:

1. A notch filter having an input and an output and comprising: a low-pass section having an input coupled to the input of the notch filter, a first output, and a second output; feedback means coupled between the second output of the low-pass section and the input of the low-pass section; and a summing section having a first input coupled to the first output of the low-pass section, a second input coupled to the second output of the low-pass section, and an output coupled to the output of the notch filter, the summing section providing an output signal being the sum of a first component signal which is proportional to the first output signal of the low-pass section and a second component signal which is proportional to the current flowing in the feedback means such that the high-frequency response of the low-pass section is compensated, the low-pass section includes a first capacitor and the feedback means includes a second capacitor such that the notch filter includes a low-pass filter of the Sallen-Key configuration, and the low-pass section further comprises an output transistor having an emitter coupled to the input of the summing section, a base, and a collector, a first voltage terminal coupled to the collector of the output transistor; and the summing section further comprises a load resistor coupled between the collector of the output transistor and the first voltage terminal, a differential amplifier including a first transistor having a base coupled to the emitter of the output transistor, an emitter, and a collector coupled to the first voltage terminal, a second transistor having a base coupled to a bias voltage source, an emitter, and a collector coupled to the collector of the output transistor an emitter resistor coupled between the emitters of the first and second transistors, and a current source coupled to the emitter of the second transistor for providing bias current to the differential amplifier.

2. The notch filter of claim 1 wherein the low-pass section further comprises a capacitance multiplier for varying the transfer characteristic of the low-pass section to render the low-pass section tunable in response to a first control input.

3. The notch filter of claim 1 wherein the capacitance multiplier comprises a first and second control input, a first and second transistor, each having a base, an emitter, and a collector; the first capacitor being coupled between the base and collector of the first transistor; a diode means having an anode coupled to the base of the first transistor and having a cathode; a third transistor having an emitter coupled to the cathode of the diode means, and having a base, and a collector; a first current source coupled to the emitters of the first and second transistors and being variable in response to the first control input; a second current source coupled to the emitter of the third transistor and being variable in response to the second control input; and a third current source coupled to the base of the first transistor.

4. The notch filter of claim 3 wherein the first and second current sources are electrically controllable so that the frequency response of the notch filter can be varied.

5. A notch filter having an input and an output and comprising: a low-pass section having an input coupled to the input of the notch filter, a first output, and a second output; feedback means coupled between the second output of the low-pass section and the input of the low-pass section; and a summing section having a first input coupled to the first output of the low-pass section, a second input coupled to the second output of the low-pass section, and an output coupled to the output of the notch filter, the summing section providing an output signal being the sum of a first component signal which is proportional to the first output signal of the low-pass section and a second component signal which is proportional to the current flowing in the feedback means such that the high-frequency response of the low-pass section is compensated, the input and output of the notch filter are differential, and wherein the input of the summing section is a differential input and the low-pass section includes a differential output stage, each side of the differential output stage of the low-pass section comprising: a transistor having an emitter coupled to the corresponding side of the differential input of the summing section; a current source coupled to the emitter of the transistor of the low-pass section for biasing purposes; the differential input of the summing section being coupled to the corresponding collector of each of the transistors of the low pass section; and the summing section further comprising a first and a second load resistor for developing a differential output voltage proportional to the current flowing in the feedback element of the low-pass section; and a differential output amplifier wherein each side of the differential output amplifier includes an output transistor having a base coupled to the output of the low-pass section, a collector, and an emitter, an emitter resistor coupled to the corresponding side of the differential output of the differential output amplifier and a load resistor coupled to the collector of the output transistor.

6. A notch filter being fully implemented in a single integrated circuit and comprising: an input terminal; an output terminal; a first voltage bus; a second voltage bus; a first transistor having a collector coupled to the first voltage bus, an emitter and a base; a first resistor coupled between the base of the first transistor and the input terminal; a first current source coupled between the emitter of the first transistor and the second voltage bus; a second transistor having a collector coupled to the first voltage bus, a base, and an emitter; a second resistor coupled between the emitter of the first transistor and the base of the second transistor; a second current source coupled between the emitter of the second transistor and the second voltage bus; a third transistor having a collector coupled to the output terminal, an emitter, and a base coupled to the emitter of the second transistor; a load resistor coupled between the collector of the third transistor and the first voltage bus; a third current source coupled between the emitter of the third transistor and the second voltage bus; a fourth transistor having a collector coupled to the first voltage bus, a base coupled to the emitter of the third transistor, and an emitter; a fifth transistor having a collector coupled to the collector of the third transistor, a base, and an emitter; a third resistor coupled between the emitters of the fourth and fifth transistors; a fourth current source coupled between the emitter of the fifth transistor and the second voltage bus; a first bias voltage terminal coupled to the base of the fifth transistor; a first capacitor coupled between the base of the first transistor and the emitter of the third transistor; a sixth transistor having a collector coupled to the base of the second transistor, a base, and an emitter; a seventh transistor having a collector coupled to the first voltage bus, a base, and an emitter coupled to the emitter of the sixth transistor; a fifth current source coupled between the emitter of the sixth transistor and the second voltage bus; an eighth transistor having a collector coupled to the first voltage bus, a base, and an emitter; a second bias voltage terminal coupled to the bases of the seventh and eighth transistors; a sixth current source coupled between the emitter of the eighth transistor and the second voltage bus; a diode having an anode coupled to the base of the sixth transistor and a cathode coupled to the emitter of the eighth transistor; a second capacitor coupled between the base and collector of the sixth transistor; and a seventh current source coupled between the first voltage terminal and the base of the sixth transistor.

7. A notch filter being fully implemented on a single integrated circuit and comprising: a differential input having a first input terminal and a second input terminal; a differential output having a first output terminal and a second output terminal; a first voltage bus; a second voltage bus; a first resistor having a first and a second end, the first end being coupled to the first input terminal; a first transistor having a base, an emitter, and a collector; a second resistor coupled between the second end of the first resistor and the base of the first transistor; a first capacitor coupled between the second end of the first resistor and the emitter of the first transistor; a second capacitor coupled between the base of the first transistor and the second voltage bus; a first current source coupled between the emitter of the first transistor and the second voltage terminal; a first diode having an anode coupled to the first voltage bus and a cathode coupled to the collector of the first transistor; a differential amplifier including a second and a fourth transistor, each having a base and a collector, the base of the second transistor being coupled to the collector of the first transistor; a third resistor coupled between the first voltage bus and the collector of the second transistor; a third transistor having a base coupled to the emitter of the first transistor, a collector coupled to the first output terminal, and an emitter; a fourth resistor coupled between the collector of the second transistor and the emitter of the third transistor; a fifth resistor coupled between the collector of the third transistor and the second voltage bus; a sixth resistor coupled between the first voltage bus and the collector of the fourth transistor; a fifth transistor having a collector coupled to the second output terminal, a base, and an emitter; a seventh resistor coupled between the collector of the fourth transistor and the emitter of the fifth transistor; an eighth resistor coupled between the collector of the fifth transistor and the second voltage bus; a sixth transistor having a collector coupled to the base of the fourth transistor, an emitter coupled to the base of the fifth transistor, and a base; a second diode having an anode coupled to the first voltage bus and a cathode coupled to the collector of the sixth transistor; a second current source coupled between the emitter of the sixth transistor and the second voltage bus; a third capacitor coupled between the base of the sixth transistor and the second voltage bus; a tenth resistor having a first end coupled to the second input terminal and a second end; a ninth resistor coupled between the second end of the tenth resistor and the base of the sixth transistor; and a fourth capacitor coupled between the emitter of the sixth transistor and the second end of the tenth resistor.

* * * * *